(12) United States Patent
Yamazaki et al.

(10) Patent No.: US 6,897,608 B2
(45) Date of Patent: *May 24, 2005

(54) LIGHT EMITTING DEVICE AND MANUFACTURING METHOD THEREOF

(75) Inventors: Shunpei Yamazaki, Tokyo (JP); Yasuyuki Arai, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/720,476

(22) Filed: Nov. 25, 2003

(65) Prior Publication Data

US 2004/0113548 A1 Jun. 17, 2004

Related U.S. Application Data

(62) Division of application No. 09/982,100, filed on Oct. 19, 2001, now Pat. No. 6,664,732.

(30) Foreign Application Priority Data

Oct. 26, 2000 (JP) ........................................ 2000-326290

(51) Int. Cl.[7] ................................................. H01J 1/62
(52) U.S. Cl. ..................................... 313/506; 313/504
(58) Field of Search ............................... 313/498, 504, 313/506, 512

(56) References Cited

U.S. PATENT DOCUMENTS

| | | |
|---|---|---|
| 5,701,055 A | 12/1997 | Nagayama et al. |
| 5,952,037 A | 9/1999 | Nagayama et al. |
| 5,952,708 A | 9/1999 | Yamazaki |
| 6,115,090 A | 9/2000 | Yamazaki |
| 6,169,293 B1 | 1/2001 | Yamazaki |
| 6,239,470 B1 | 5/2001 | Yamazaki |

FOREIGN PATENT DOCUMENTS

| | | |
|---|---|---|
| EP | 0 732 868 A1 | 9/1996 |
| JP | 8-315981 | 11/1996 |
| JP | 10-321372 | 12/1998 |
| JP | 2000-331784 | 11/2000 |

OTHER PUBLICATIONS

U.S. Appl. No. 09/748,166, pending, Yamazaki.
U.S. Appl. No. 09/929,264, pending, Yamazaki et al.
U.S. Appl. No. 09/986,425, pending, Yamazaki.
T. Tsutsui et al.; "Electroluminescence In Organic Thin Films"; *Photochemical Processes in Organized Molecular Systems*; pp. 437–450; 1991.
M.A. Baldo et al., "Highly Efficient Phosphorescent Emission from Organic Electroluminescent Devices"; *Nature*, vol. 395; pp. 151–154; Sep. 10, 1998.
M.A. Baldo et al.; "Very High–Efficiency Green Organic Light–Emitting Devices Based on Electrophosphorescence"; *Applied Physics Letters*, vol. 75, No. 1; pp. 4–6; Jul. 5, 1999.
T. Tsutsui et al.; "High Quantum Efficiency in Organic Light–Emitting Devices with Iridium–Complex as a Triplet Emissive Center"; *Japan Journal of Applied Physics*, vol. 38, Part 3BB, pp. L1502–L1504; Dec. 15, 1999.

*Primary Examiner*—Vip Patel
(74) *Attorney, Agent, or Firm*—Fish & Richardson P.C.

(57) ABSTRACT

The concentration of oxygen, which causes problems such as decreases in brightness and dark spots through degradation of electrode materials, is lowered in an organic light emitting element having a layer made from an organic compound between a cathode and an anode, and in a light emitting device structured using the organic light emitting element. The average concentration of impurities contained in a layer made from an organic compound used in order to form an organic light emitting element having layers such as a hole injecting layer, a hole transporting layer, a light emitting layer, an electron transporting layer, and an electron injecting layer, is reduced to $5\times10^{19}/cm^2$ or less, preferably equal to or less than $1\times10^{19}/cm^2$, by removing the impurities with the present invention. Formation apparatuses are structured as stated in the specification in order to reduce the impurities in the organic compounds forming the organic light emitting elements.

34 Claims, 10 Drawing Sheets

Fig. 3
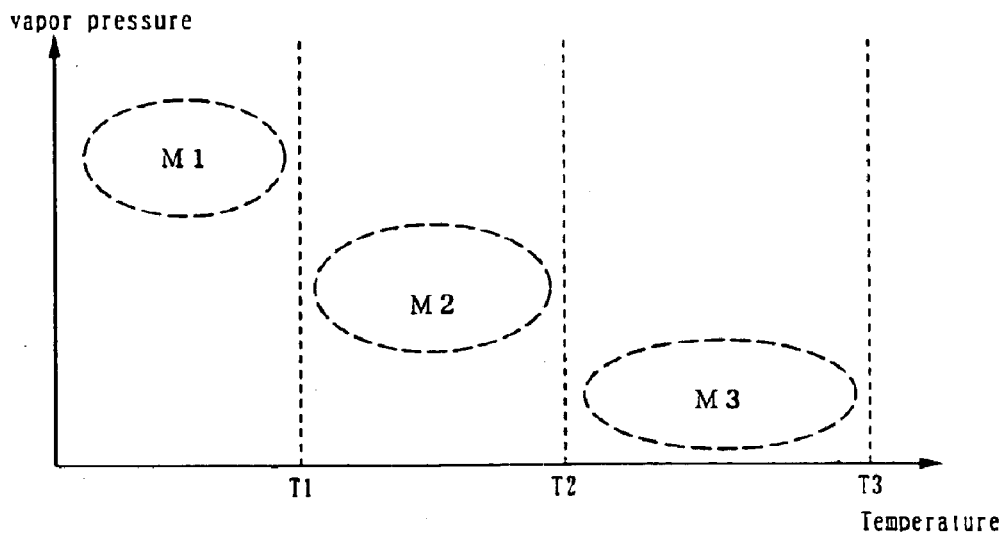
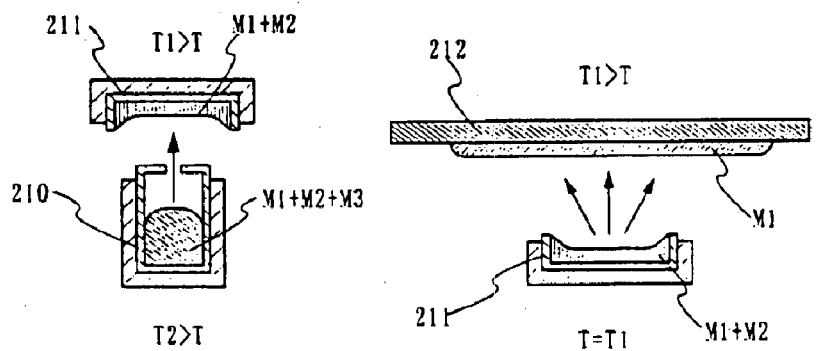
Fig. 4A    Fig. 4B
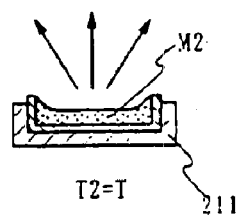
Fig. 4C

LIGHT EMITTING DEVICE AND MANUFACTURING METHOD THEREOF

CROSS-REFERENCE TO RELATED APPLICATIONS

This application is a divisional (and claims the benefit of priority under 35 USC 120) of U.S. application Ser. No. 09/982,100, filed Oct. 19, 2001, now U.S. Pat. No. 6,664,732 which, under 35 USC 119, claims the benefit of a foreign priority application filed in Japan as serial number 2000-326290 on Oct. 26, 2000. This application claims priority to both of these applications, and both of these applications are incorporated by reference.

BACKGROUND OF THE INVENTION

1. Field of the Invention

The present invention relates to a light emitting material in which generated electroluminescence is obtained by imparting an electric field, and to a light emitting device using the light emitting material. In particular, the present invention relates to a light emitting device using an organic compound in the light emitting material.

2. Description of the Related Art

Display devices using liquid crystals have a typical construction which uses a back light or a front light, and they display an image using that light. Liquid crystal display devices are employed as image display means in various types of electronic devices, but they have a structural disadvantage in that their angle of view is narrow. In contrast, display devices using light emitting materials in which electroluminescence is obtained have a wide angle of view, and are the focus of next generation display devices due to their superior visibility.

Light emitting elements using organic compounds as light emitting materials (hereafter referred to as organic light emitting elements) are structured by appropriately combining layers such as hole injecting layers, hole transporting layers, light emitting layers, electron transporting layers, and electron injecting layers, formed by organic compounds, between a cathode and an anode. Although hole injecting layers and hole transporting layers are represented here as being distinct, they are the same in that hole transportability (hole mobility) is their particularly important property. In order to make distinction convenient, the hole injecting layer is taken as the layer on the side contacting the anode, and the hole transporting layer is taken as the layer on the side contacting the light emitting layer. Also, the electron injecting layer is taken as the layer containing the cathode, and the electron transporting layer is taken as the layer on the side containing the light emitting layer. There are times when the light emitting layer also serves as an electron transporting layer, and therefore it is also referred to as a light emitting electron transporting layer. Light emitting elements formed by combining these types of layers show rectification characteristics, and have structures similar to diodes.

It is thought that structures that emit light by electroluminescence do so by a phenomenon in which electrons injected from the cathode and holes injected from the anode recombine in the layer made from the light emitting material (light emitting layer), forming excitons, and light is irradiated when the excitons return to the ground state. Fluorescence and phosphorescence exist as types of electroluminescence, and these are understood as light emission from a singlet state (fluorescence) and light emission from a triplet state (phosphorescence) in the excited state. The brightness of the light emitted reaches from several thousands to several tens of thousands of $cd/m^2$, and therefore it is considered possible to apply electroluminescence in theory to display devices and the like. However, various types of degradation phenomena also exist, and several problems to their practical application remain.

It is thought that there are five causes of degradation to light emitting materials made from organic compounds, and to organic light emitting elements: 1) chemical degradation of the organic compound (via the excited state); 2) melting of the organic compound due to heat generated during driving; 3) dielectric breakdown originating in macro faults; 4) degradation of the electrodes or electrode/organic layer interfaces: and 5) degradation due to instabilities in the amorphous structure of the organic compound.

The above first to third causes of degradation are due to driving of the organic light emitting element. The generation of heat is inevitable because electric current flowing within the element is converted into joule heat. If the melting point of the organic compound, or the glass transition temperature, is low, it is thought that melting will occur. Further, the existence of pinholes or cracks within the organic compound will concentrate the electric field in those locations and cause dielectric breakdown. Degradation proceeds even if the light emitting element is maintained at room temperature with the fourth and the fifth causes. The fourth cause is known as dark spots, and is due to cathode oxidation and reactions with moisture. The fifth cause is due to the fact that all organic compounds used in the organic light emitting element are amorphous materials. It is thought that crystallization occurs during long term storage, changes by long time, and the generation of heat, and that there are almost no materials with a stable amorphous structure can be maintained.

Dark spots can be well suppressed by using better sealing techniques, but in practice, degradation is caused by a composite of the aforementioned reasons, and the situation is difficult in order to be uniformly understood. A method in which organic light emitting elements formed on a substrate are sealed airtight by a sealing material, and a drying agent is formed on the inside space, is known as a typical sealing technique. However, the phenomenon in which the electric current flowing in the organic light emitting elements decreases, along with a decrease in the brightness of emitted light, if a constant voltage is continually applied to the light emitting element is thought to originate in the physical properties of the organic compound.

Both low molecular weight organic compounds and high molecular weight organic compounds are known as organic compounds for forming organic light emitting elements. Compounds such as the following are known as examples of low molecular weight organic compounds: á-NPD (4,4'-bis(N-(1-naphthyl)-N-phenylamino)-biphenyl), which is a copper phthalocyanine (CuPc) aromatic amine-based material, and MTDATA (4,4',4"-tris(N-3-methylphenyl-N-phenylamino)triphenylamine) as hole injecting layers; and tris-8-quinolinolate aluminum complex($Alq_3$) as a light emitting layer. Among the high molecular weight organic light emitting materials, examples such as polyaniline and polythiophene derivatives (PEDOT) are known.

Looking at the diversity of materials, low molecular weight organic compounds manufactured by evaporation have a remarkable diversity compared to high molecular weight organic materials. However, whatever material is used, organic materials which can be made purely from only basic structural units are rare. Different kinds of bonds and impurities are mixed in by manufacturing processes, and there are also times when various additives such as pigments are added. Further, these types of materials include those which deteriorate due to moisture and which are easily oxidized. It is possible for moisture, oxygen, and the like to easily become mixed in from the atmosphere, and therefore caution is required in material handling.

It is known that when organic compounds are degraded by light, chemical bonds become double bonds and the structure changes to one containing oxygen (such as —OH, —OOH, >C=O, —COOH). It is therefore thought that the bonding state changes and degradation advances if the organic compounds are placed within an atmosphere containing oxygen, or if oxygen or $H_2O$ exist as impurities within the organic compounds.

Seen as a diode, one type of semiconductor element, it is known that impurities caused by oxygen form localized levels within the forbidden bands in semiconductor elements having semiconductor junctions, and that this causes junction leakage and drops in the carrier lifetime, thereby greatly reducing the semiconductor element properties.

FIG. 11 is a graph showing the distribution in the depth direction of oxygen (O), nitrogen (N), hydrogen (H), silicon (Si), and copper (Cu), measured by secondary ion mass spectroscopy (SIMS), in an organic light emitting element. The structure of the sample used in making the measurements is as follows: tris-8-quinolinolate aluminum complex ($Alq_3$)/carbazole-based material ($Ir(ppy)_3$+CBP)/copper phthalocyanine (CuPc)/oxide conductive material (ITO)/glass substrate. $Alq_3$ contains oxygen within its molecular structure, as shown by the chemical formula (Chem 1) below.

Chem 1

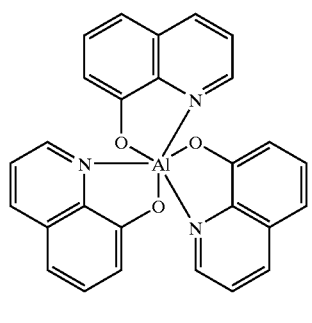

$Alq_3$

On the other hand, $Ir(ppy)_3$+CBP and CuPc are structured such that there is no oxygen contained within their molecules, as shown by the following chemical formulae (Chem 2 and Chem 3):

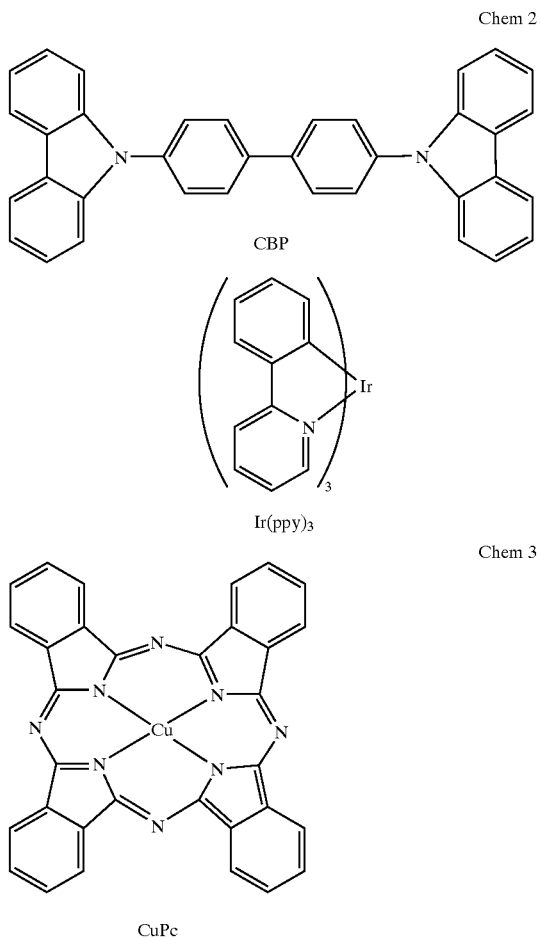

The oxygen concentration becomes high in the $Alq_3$ region and in a certain part of the ITO region in the concentration distributions of each of the elements shown by FIG. 11 for this reason. Conversely, the oxygen concentration is reduced in the $Ir(ppy)_3$+CBP and CuPc layers. However, ions are detected on the order of $7 \times 10^2$ counts/sec, and it can be confirmed that oxygen exists in regions at which oxygen is not expected to be.

The highest occupied molecular orbital (HOMO) level degenerates and therefore oxygen molecules are unique triplet state molecules at their base state. Normally, the process from triplet to singlet excitation becomes more difficult to occur due to forbidden transitions (spin prohibitions), and therefore singlet state oxygen molecules are not generated. However, if triplet excitation state molecules ($^3M^*$) having an energy state that is higher than the singlet state exist in the periphery of the oxygen molecules, then this can lead to a reaction in which singlet state oxygen molecules are generated, in accordance with energy transfers occurring as shown below.

$$^3M* + {}^3O_2 \rightarrow M + {}^1O_2$$

Seventy-five percent of the molecular excitation state in the light emitting layers of organic light emitting elements is said to be triplet state. Therefore, if oxygen molecules are mixed within the organic light emitting elements, then the generation of singlet state oxygen molecules can be obtained by the energy transfer of Eq 1. Singlet excitation state oxygen molecules have ionic nature (bias to electric charge), and therefore it is thought that there is the possibility of reaction with the electric charge bias developing in the organic compound.

For example, methyl group in batho-cuproene (hereafter referred to as BCP) is an electron donor, and therefore carbon directly bonded to conjugate rings is positively electrified. As shown by Chem 4 below, singlet oxygen with ionic properties reacts with carbon which is positively electrified, and there is the possibility that carboxylic acid and hydrogen are formed as shown by Chem 5 below. As a result, it can be expected that the electron transportability will decrease.

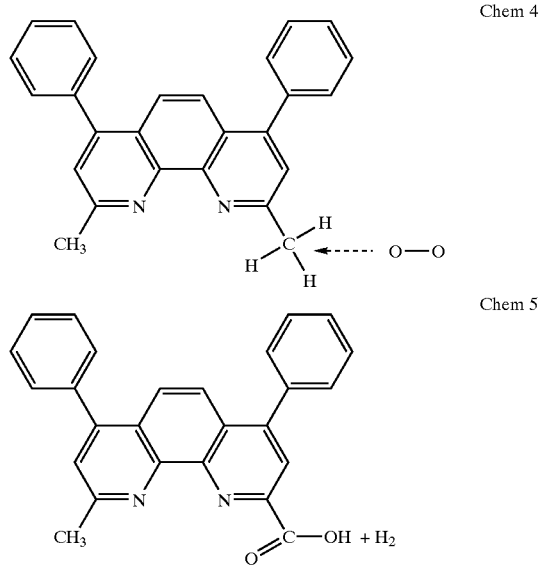

Chem 4

Chem 5

SUMMARY OF THE INVENTION

Based on these considerations, it has been found that impurities such as oxygen and $H_2O$ contained within organic compounds are impurities which cause a variety of types of degradation such as a reduction in brightness in organic light emitting elements and in organic light emitting devices using the organic light emitting elements.

A first object of the present invention is to reduce the concentration of oxygen, which causes electrode material degradation such as reductions in brightness and dark spots, in organic light emitting elements having layers made from organic compounds between a cathode and an electrode, and in light emitting devices structured by using the organic light emitting elements.

A desirable applied example using organic light emitting elements is an active matrix drive light emitting device in which a pixel portion is formed by the organic light emitting elements. A thin film transistor (hereafter referred to as TFT) is formed in each pixel as an active element. It is known that the values of the properties of TFTs formed using semiconductor films, such as the threshold voltage, fluctuate due to alkaline metal contamination. A second object of the present invention is to provide an appropriate structure for forming a pixel portion by combining organic light emitting elements, which use alkaline metals having small work coefficients in their cathodes, with TFTs.

With the present invention, impurities which contain oxygen, such as oxygen and $H_2O$, contained within organic compounds used for forming an organic light emitting element are reduced in order to prevent degradation of a light emitting device. Oxygen, hydrogen, and the like are of course contained as structural elements with organic compounds, and the term impurities corresponding to organic compounds refers to exogenous impurities not contained within the conventional molecular structure in the present invention. These types of impurities are expected to be present within organic compounds as atoms, molecules, free radicals, and oligomers.

In addition, the present invention has a structure for preventing problems such as fluctuations of the threshold voltage due to alkaline metals, such as sodium and potassium, contaminating the TFTs in an active matrix drive light emitting device.

With the present invention, such impurities are eliminated, and the average concentration of impurities contained in layers made from organic compounds which is used in order to form organic light emitting elements such as hole injecting layers, hole transporting layers, light emitting layers, electron transporting layers, and electron injecting layers, is reduced to be less than or equal to $5 \times 10^{19}/cm^2$, preferably less than or equal to $1 \times 10^{19}/cm^2$. In particular, it is necessary to reduce the oxygen concentration in the light emitting layer and its vicinity.

When an organic light emitting element emits light at a brightness of 1000 $Cd/cm^2$, this corresponds to an emission amount of $10^{16}$ photons/sec-$cm^2$ when converted. If the quantum efficiency of the organic light emitting element is assumed to be 1%, then it is necessary to have an electric current density of 100 mA/$cm^2$. In accordance with an empirical rule based on semiconductor elements such as solar batteries and photodiodes using amorphous semiconductors, it is necessary to have a defect level concentration equal to or less than $10^{16}/cm^3$ in order to obtain good characteristics for elements in which this order of electric current is flowing. In order to achieve this value, it is necessary that the concentration of harmful impurity elements forming the defect level should be reduced to an amount less than or equal to $5 \times 10^{19}/cm^2$, preferably less than or equal to $1 \times 10^{19}/cm^2$ as above.

An apparatus for forming organic compounds used in making organic light emitting elements, and for reducing the organic compound impurities, is structured as follows.

The side walls on the inside of a film formation chamber in an evaporation apparatus for forming layers made from low molecular weight organic compounds are given a mirrored surface by electrolytic polishing, reducing the amount of gas emission. The material used in the film formation chamber is stainless steel or aluminum. Heaters are formed on the outside of the film formation chamber for the purpose of preventing gas emission from the inside walls, and a baking process is performed. Gas emissions can be greatly reduced by the baking process, and conversely, it is preferable to perform cooling by using a refrigerant during evaporation. A turbo molecular pump and a dry pump are used in the evacuation system, preventing reverse diffusion of oil vapor from the evacuation system. Further, a cryo-pump may also be used in conjunction with the other pumps in order to eliminate any remaining $H_2O$.

The evaporation source is based on a resistance heating type, but a Knudsen cell may also be used. The evaporation material is introduced into the film formation chamber from an exchange chamber of load lock type attached to the film formation chamber. Exposure of the film formation chamber to the atmosphere is thus prevented as much as possible during evaporation of the evaporation material. The evaporation source is mainly an organic material, and sublimation purification is performed within the film formation chamber before evaporation. Further, a zone purification method may also be applied.

Preprocessing of a substrate introduced to the film formation chamber may be by gas emission processing performed by heat treatment, or by plasma processing using argon. Impurities emitted from the substrate are reduced as much as possible. TFTs are already formed on the substrate on which the organic light emitting elements are to be made in an active matrix drive light emitting device. If insulating layers using organic resin materials are appropriately applied as structural elements of the substrate, then it is necessary to reduce gas emissions from the organic resin materials. Further, nitrogen gas and argon gas introduced into the film formation chamber are purified at the supply gate.

On the other hand, the control of the amount of polymerization cannot be completely performed for cases of forming layers made from high molecular weight organic compounds, and therefore a range of molecular weights develops and the melting point cannot be non-ambiguously determined. In this case a dialysis method or a high speed liquid chromatography method is applied. In particular, as the dialysis method, an electric dialysis method is suitable in removing ionic impurities with good efficiency.

The concentration of oxygen, which can lead to decreases in brightness and degradation of electrode materials such as dark spots, is thus reduced by using means such as those discussed above.

One form of a structure for active matrix drive, in which each pixel in a pixel portion formed by the organic light emitting elements that are formed as shown above is controlled by active elements, has TFTs formed on a substrate, each TFT having a semiconductor film, a gate insulating film, and a gate electrode, and organic light emitting elements are formed on the TFTs. A glass substrate is typically used as the substrate, and a minute amount of an alkaline metal is contained in barium borosilicate glass or aluminum borosilicate glass. The semiconductor film is covered by silicon nitride and silicon oxynitride in order to prevent contamination by alkaline metals from the glass substrate on the lower side and from the organic light emitting elements on the upper side.

On the other hand, the organic light emitting elements, which are preferably formed on a level surface, are formed on a leveling film made from an organic resin material such as polyimide or acrylic. However, this type of organic resin film is hygroscopic. The organic light emitting elements, which degraded by oxygen and $H_2O$, are covered by silicon nitride, silicon oxynitride, and diamond-like carbon (DLC) which have a characteristic to barrier gases.

FIG. 12 is a diagram for explaining the concept of an active matrix drive light emitting device of the present invention. A TFT 1201 and an organic light emitting element 1202 are formed on the same substrate as structural elements of a light emitting device 1200. The structural elements of the TFT 1201 are elements such as a semiconductor film, a gate insulating film, and a gate electrode, and elements such as silicon, hydrogen, oxygen, and nitrogen are contained in the structural elements. In addition, there are also elements such as metals for forming the gate electrode. On the other hand, the organic light emitting element 1202 contains alkaline metals such as lithium in addition to the main structural element of the organic compound material, carbon as elements.

Silicon nitride or silicon oxynitride 1205 is formed as a blocking layer on the lower side of the TFT 1201 (a glass substrate 1203 side). Silicon oxynitride 1206 is formed as a protective film on the opposite side, the upper side of the TFT 1201. On the lower side of the organic light emitting element 1202 is a silicon nitride or silicon oxynitride 1207 formed as a protective layer. A DLC film is formed as a protective film on the upper side of the organic light emitting element 1202. An organic resin interlayer insulating film 1204 is formed between both of the TFT 1201 and the organic light emitting element 1202, and is united with both of them. Alkaline metals such as sodium, those most disliked by the TFT 1201, are blocked by the silicon nitride or silicon oxynitride 1205 and by the silicon oxynitride 1206. On the other hand, the organic light emitting element 1202 most dislikes oxygen and $H_2O$, and therefore the silicon nitride or silicon oxynitride 1207 and the DLC film 1208 are formed in order to block oxygen and $H_2O$. Further, they also function in order to prevent alkaline metal elements in the organic light emitting element 1202 from reaching the outside.

In order to satisfy reciprocal quality with respect to impurity contamination, degradation due to mutual contamination of impurities is prevented by cleverly combining insulating films that block oxygen and $H_2O$ and by forming insulating films in light emitting devices thus structured by combining TFTs and organic light emitting elements.

Note that, in this specification, the term light emitting device indicates general devices which use the light emitting materials described above. Further, modules in which a TAB (tape automated bonding) tape or a TCP (tape carrier package) is attached to an element having a layer containing the above-mentioned light emitting material between an anode and a cathode, modules in which a printed wiring substrate is formed on the tip of a TAB tape or a TCP, and modules in which an IC is mounted by a COG (chip on glass) method on the substrate on which the light emitting elements are formed, are all contained in the category of light emitting devices.

Further, the concentration of oxygen as an impurity element indicates the lowest concentration measurable by secondary ion mass spectroscopy (SIMS) in this specification.

BRIEF DESCRIPTION OF THE DRAWINGS

In the accompanying drawings:

FIG. 3 is a diagram for explaining the relationship between impurities contained in an organic compound material and the evaporation pressure;

FIGS. 4A to 4C are diagrams for explaining a method for performing sublimation purification within a film formation apparatus;

DETAILED DESCRIPTION OF THE PREFERRED EMBODIMENTS

[Embodiment 1]

Figure 1:
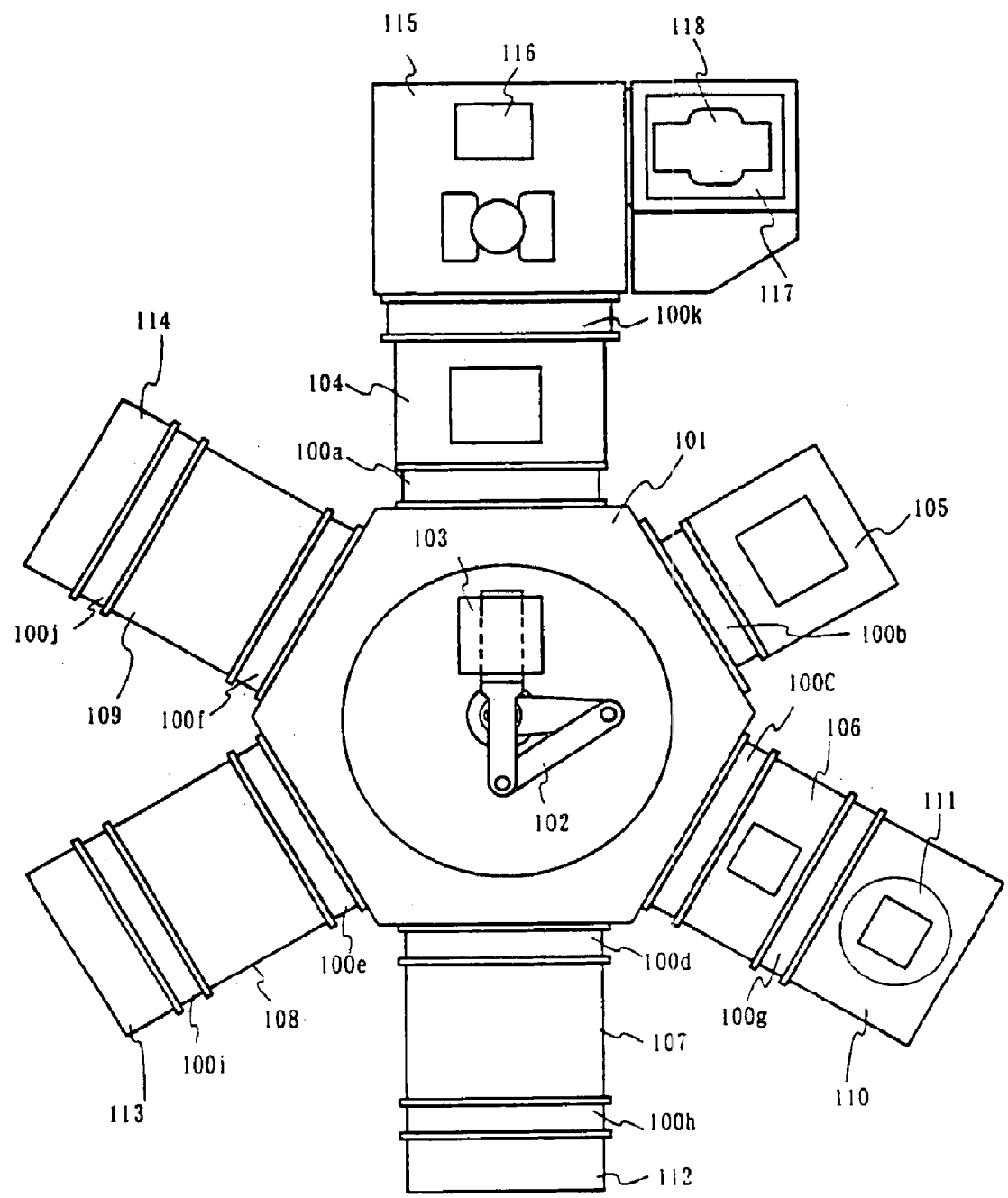
FIG. 1 is a diagram for explaining a structure of a film formation apparatus of the present invention.

An example of an organic light emitting element manufacturing apparatus capable of reducing the concentration of impurities such as oxygen and $H_2O$ contained in an organic compound is explained using FIG. 1. FIG. 1 shows an apparatus for performing the formation of layers made from organic compounds, the formation of cathodes, and sealing. A conveyor chamber 101 is connected to a loading chamber 104, a preprocessing chamber 105, an intermediate chamber 106, and film formation chambers (A) 107 to (C) 109 through gates 100a to 100f respectively. The preprocessing chamber 105 is formed with the goal of performing gas emission processing of the substrate to be processed, and improving the surface of the substrate. It becomes possible to perform heat treatment in a vacuum and to perform plasma processing using an inert gas.

The film formation chambers (A) 107 and (B) 108 are processing chambers for forming films, made mainly from low molecular weight organic compounds, using evaporation. The film formation chamber (C) 109 is a processing chamber for film formation of cathodes containing alkaline metals by evaporation. Material exchange chambers 112 to 114 loaded with evaporation materials as evaporation sources are connected to the film formation chambers (A) 107 to (C) 109 through gates 100h to 100j, respectively. The material exchange chambers 112 to 114 are used in order to load the evaporation materials without exposing the film formation chambers (A) 107 to (C) 109 to the atmosphere.

First, a substrate 103 on which films are to be deposited is installed in the load chamber 104, and is moved to the preprocessing chamber and to each of the film formation chambers by a conveyor mechanism (A) 102 in the conveyor chamber 101. A low pressure state is maintained in the load chamber 104, the conveyor chamber 101, the preprocessing chamber 105, the intermediate chamber 106, the film formation chambers (A) 107 to (C) 109, and the material exchange chambers 112 to 114 by evacuation means. The evacuation means pulls a vacuum on the order of 1 Pa from atmospheric pressure by using an oil free dry pump, and greater vacuum levels are evacuated by a magnetic levitation turbo molecular pump or a compound molecular pump. A cryo-pump may also be used in combination in the film formation chambers in order to remove $H_2O$. Reverse diffusion of oil vapor from the evacuation means is thus prevented.

The inside wall surfaces of the evacuated chambers are processed and given a mirrored surface by electrolytic polishing, reducing the surface area and preventing gas emission. Stainless steel or aluminum is used in the sidewalls. It is also preferable to form a heater on the outside of the film formation chamber, and perform baking processing, with the goal of reducing gas emissions from the inside walls. Gas emissions can be greatly reduced by the baking processing. In addition, cooling using a refrigerant during evaporation in order to prevent impurity element contamination by emitted gasses may also be used. A vacuum as low as $1\times10^{-6}$ Pa can thus be achieved.

The intermediate chamber 106 is connected to an application chamber 110 prepared with a spinner 111 through a gate 100g. The application chamber 110 is a processing chamber for forming films of organic materials made mainly from high molecular weight materials by a spin coating method, and this processing is performed in the atmosphere. Removal and insertion of the substrate is therefore performed through the intermediate chamber 106 under the pressure regulated to be the same pressure as that of the room to which the substrate is being moved. The high molecular weight organic material provided in the application chamber is purified by a dialysis method, an electric dialysis method, or a high speed liquid chromatograph and performed. Purification is performed at the supply gate.

Preprocessing of the substrate introduced into the film formation chamber is done in the preprocessing chamber 105 by performing gas emission processing in accordance with heat treatment and by performing argon plasma surface processing, reducing impurities emitted from the substrate as much as possible. In particular, for cases in which there is an interlayer insulating film made from an organic resin material on the substrate, or when a pattern is formed, $H_2O$ occluded by the organic resin material is emitted under reduced pressure, and therefore the interior of the film formation chamber becomes contaminated. Consequently, the substrate is heat treated and gas emission processing is performed in the preprocessing chamber 105, or plasma processing is performed, making the surface finer and reducing the amount of gas emitted. Nitrogen gas and argon gas introduced into the film formation chambers here are purified by purification means using a gettering material.

The method of evaporation is a resistance heating method, but a Knudsen cell for precisely controlling temperature and controlling the amount of evaporation may also be used. The evaporation material is introduced to the film formation chamber from a specialized material exchange chamber attached to the film formation chamber. Exposure of the film formation chamber to the atmosphere is thus prevented as much as possible. A variety of gasses, such as $H_2O$, are adsorbed by the internal walls if the film formation chamber is exposed to the atmosphere, and these gasses are re-emitted due to the pulling of a vacuum. The amount of time for the emission of the adsorbed gasses to settle down and for the vacuum level to reach a stable equilibrium value requires from several tens to several hundreds of hours. The walls of the film formation chamber are therefore baked, reducing the required amount of time. However, repeated exposure to the atmosphere is not an effective method, and therefore it is preferable to form a specialized material exchange chamber as shown in FIG. 1. The evaporation source is mainly an organic material, and purification sublimation is performed within the film formation chamber before evaporation. Further, a zone purification method may also be applied.

A sealing chamber 115, on the other hand, cut off by the load chamber 104, performs processing in order to seal the substrate using a sealing material after formation up through the cathode is complete, without exposing the substrate to the atmosphere. An ultraviolet irradiation mechanism 116 is used for cases in which the sealing material is fixed in place by an ultraviolet setting resin. A conveyor mechanism (B) 118 is formed in a delivery chamber 117 and the substrate is maintained there after completing up through sealing in the sealing chamber 115.

Figure 2:
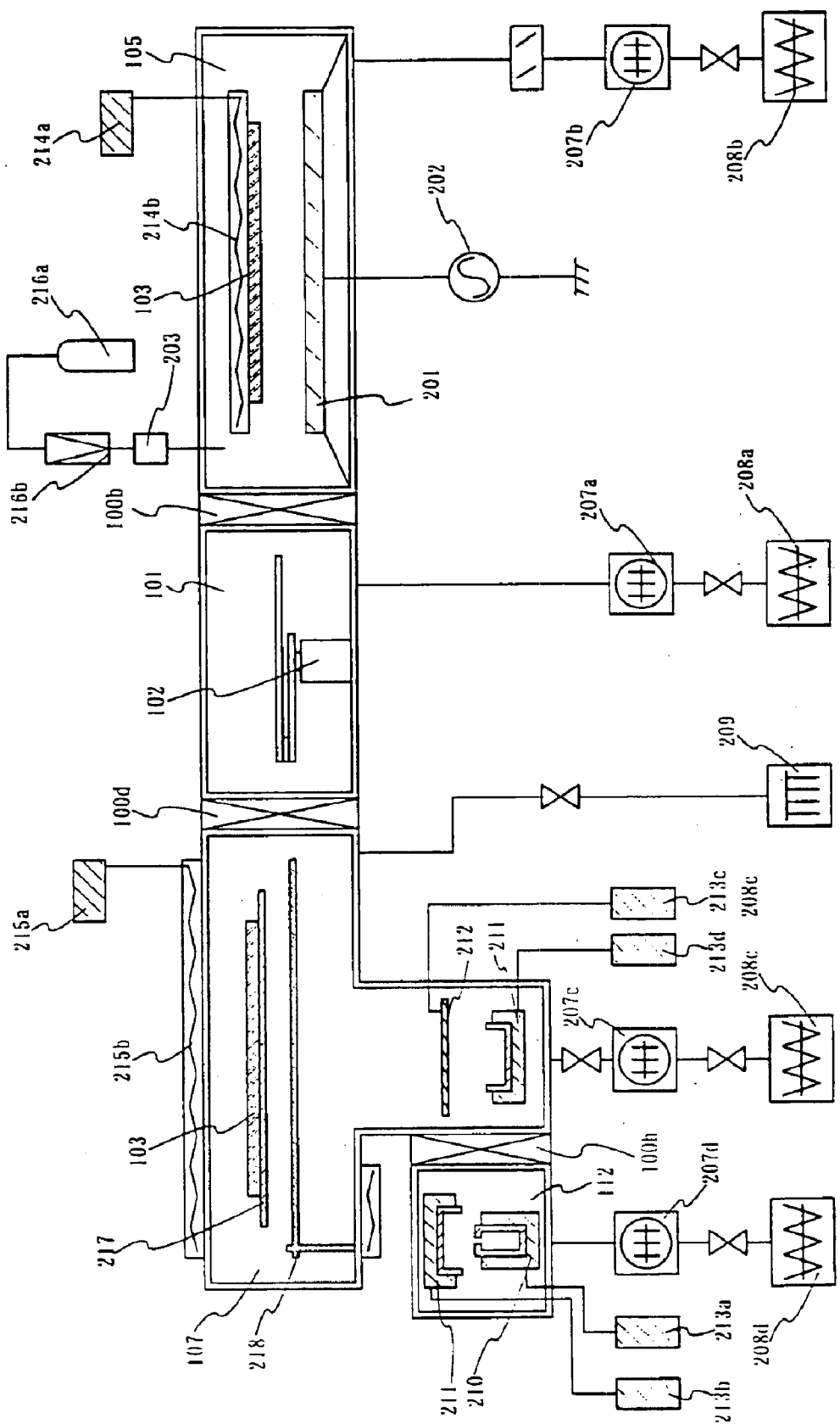
FIG. 2 is a diagram for explaining a structure of a film formation apparatus of the present invention.

FIG. 2 is a diagram for explaining detailed structures of the conveyor chamber 101, the preprocessing chamber 105, and the film formation chamber (A) 107. The conveyor mechanism (A) 102 is formed in the conveyor chamber 101. Evacuation means in the conveyor chamber 101 is performed by using a magnetic levitation compound molecular pump 207a and a dry pump 208a. The preprocessing chamber 105 and the film formation chamber 107 are connected with the conveyor chamber 101 through the gates 100b and 100d. A high frequency electrode 201 connected to a high frequency electric power source 202 is formed in the preprocessing chamber 105, and the substrate 103 is maintained by an opposing electrode on which substrate heat treatment means 214a and 214b are prepared. Impurities such as moisture adsorbed on the substrate 103 can be driven away by performing heat treatment within a vacuum and at a temperature of 50 to 120° C. by the substrate heat treatment means 214a and 214b. Gas introduction means connected to the preprocessing chamber 105 is composed of a cylinder 216a, a flow regulator 216b and a purifier 203 formed from a gettering material.

Surface processing by plasma is performed by purifying an inert gas such as helium, argon, krypton, or neon, or a gas mixture of an inert gas and hydrogen, by using the purifier 203, and then applying high frequency electric power and exposing the substrate within the plasma atmosphere. It is preferable that the purity of the gas used should be such that the concentration of $CH_4$, $CO$, $CO_2$, $H_2O$, and $O_2$ are each less than or equal to 2 ppm, preferably less than or equal to 1 ppm.

Evacuation means is performed by using a magnetic levitation compound molecular pump 207b and a dry pump 208b. Pressure control within the preprocessing chamber 105 during surface processing is performed by controlling the evacuation speed by using a control valve prepared in the evacuation means.

The film formation chamber 107 is prepared with an evaporation source 211, an adsorption plate 212, a shutter 218, and a shadow mask 217. The substrate 103 is placed on the shadow mask 217. The shutter 218 is an open-close type, and opens during evaporation. The evaporation source 211 and the adsorption plate 212 have their temperature controlled, and are connected to heat treatment means 213d and 213c, respectively. The evacuation system is a turbo molecular pump 207c and a dry pump 208c, and by adding a cryo-pump 209, it is possible to remove any remaining moisture within the film formation chamber. It becomes possible to reduce the amount of gas emitted from the interior walls of the film formation chamber by performing baking processing. The baking process is performed by pulling a vacuum using the turbo molecular pump or the cryo-pump connected to the evacuation system while heating the film formation chamber to a temperature on the order of 50 to 120° C. This makes it possible to form a vacuum on the order of $1\times10^{-6}$ Pa by then cooling the temperature of the film formation chamber to room temperature or a temperature on the order of liquid nitrogen by using a refrigerant.

Evaporation sources 210 and 211 are prepared in the material exchange chamber 112 cut off by the gate 100h, and the temperature is controlled by heat treatment means 213a and 213b. A turbo molecular pump 207d and a dry pump 208d are used in an evacuation system. The evaporation source 211 is capable of being moved between the material exchange chamber 112 and the film formation chamber 107, and is used as means of performing purification of the evaporation material supplied.

There are no limitations placed on methods of purifying the evaporation material, but it is preferable to employ sublimation purification if purification is performed within the film formation apparatus. A zone purification method may also be performed, of course. FIG. 3 and FIGS. 4A to 4C are diagrams for explaining a method of performing sublimation purification within the film formation apparatus explained by FIG. 2.

Many organic compounds for forming organic light emitting elements easily degrade due to oxygen and $H_2O$. In particular, low molecular weight organic compounds have a strong tendency to do so. Therefore, even if they are sufficiently purified to a high level at first, it is possible that oxygen or $H_2O$ may easily be taken in due to subsequent handling. As discussed above, it is thought that oxygen taken in by organic compounds is a harmful impurity, which causes changes in the molecular bonding state. This leads to changes with time in the organic light emitting elements, and becomes a cause of deterioration in properties.

FIG. 3 is a diagram for explaining the general idea of sublimation purification of organic compound materials. The original achieved organic compound is taken as M2, and evaporation is performed between temperatures T1 and T2 under a constant pressure. Compounds having a high vapor pressure below T1 are taken as M1, and M1 corresponds to impurities such as $H_2O$. Further, compounds having a high vapor pressure above T2 are taken as M3, and M3 corresponds to compounds such as transition metals and organic metals.

Materials containing M1, M2, and M3, which have differing vapor pressures, are entered into a first evaporation source 210 and heated to a temperature lower than T2, as shown in FIG. 4A. The materials which sublimate from the first evaporation source are M1 and M2, and if a second evaporation source 211 is formed above the first evaporation source at this point and maintained at a temperature lower than T1, M1 and M2 can be adsorbed there. Next, as shown in FIG. 4B, M1 sublimates if the second evaporation source 211 is heated to the T1 temperature, and M1 is adsorbed by the adsorption plate 212. M1 and M3 are removed from the second evaporation source 211, and M2 remains. Next, as shown in FIG. 4C, the second evaporation source 211 is heated to a temperature on the order of T2 and an organic compound layer is formed on the substrate.

The processes of sublimation purification shown by FIGS. 4A to 4C can be performed within the material exchange chamber 112 and the film formation chamber 107 of the film formation apparatus explained by FIG. 2. The level of cleanliness within the film formation chamber is high due to giving the interior walls a mirrored surface and performing evacuation by the turbo molecular pump and the cryo-pump, and therefore the oxygen concentration within the organic compound evaporated onto the substrate can be reduced to be less than or equal to $1\times10^{19}/cm^3$ preferably less than or equal to $1\times10^{19}/cm^3$.

[Embodiment 2]

There are no limitations placed on the structure of the organic light emitting elements manufactured using the film formation apparatus shown in Embodiment 1. Organic light emitting elements are formed by an anode made from a transparent conductive film, a cathode containing an alkaline metal and a layer made from an organic compound therebetween. The layer made from an organic compound is composed of a single layer or a plurality of layers. Each layer is referred to separately by names such as hole injecting layer, hole transporting layer, light emitting layer, electron transporting layer, and electron injecting layer, depending on its purpose and function. These layers can be formed from either low molecular weight organic compound materials or high molecular weight organic compound materials, or can be formed by appropriately combining both.

Organic compound materials having superior hole transporting properties are selected for hole injecting layers and hole transporting layers, and typically a phthalocyanine-based or aromatic amine-based material is employed. Further, materials such as metal complexes having superior electron transporting properties are used in electron injecting layers.

Figure 5A:
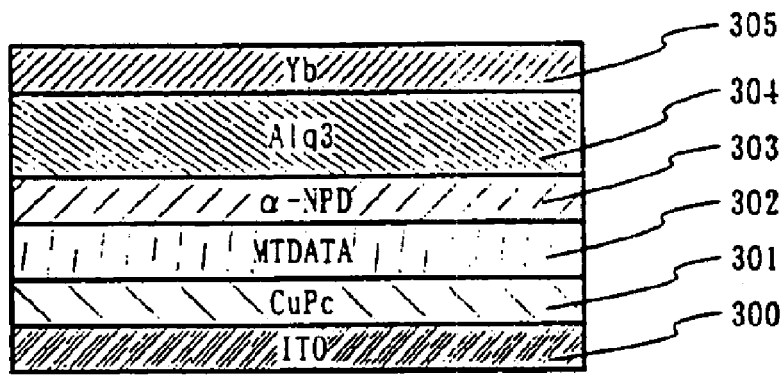
FIGS. 5A to 5C are diagrams for explaining structure of organic light emitting elements.
Figure 5B:
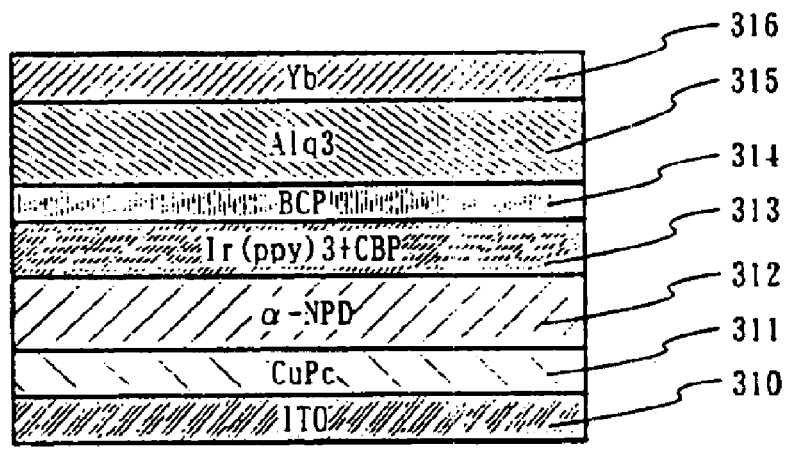
Figure 5C:
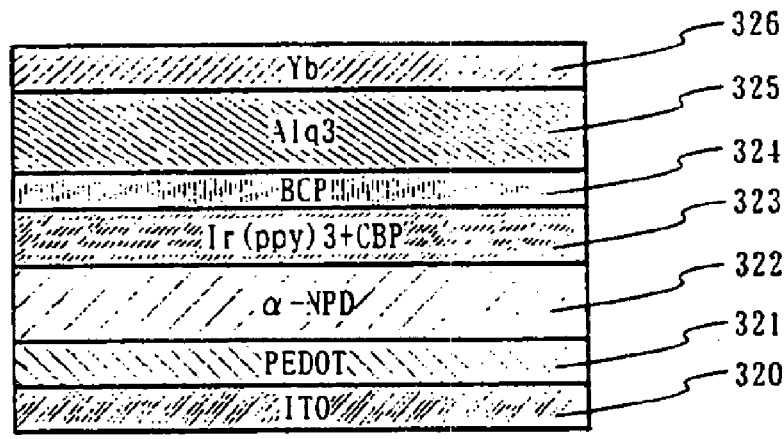

FIGS. 5A to 5C show examples of organic light emitting element structures. FIG. 5A is an example of an organic light emitting element formed by low molecular weight organic compounds, and an anode 300 formed from indium tin oxide (ITO), a hole injecting layer 301 formed from copper phthalocyanine (CuPc), hole transporting layers 302 and 303 formed from aromatic amine-based materials MTDATA and α-NPD, an electron injecting and light emitting layer 304 formed from tris-8-quinolinolate aluminum complex (Alq$_3$), and a cathode 305 made from ytterbium (Yb) are laminated. Alq$_3$ is capable of emitting light from a singlet excitation state (fluorescence).

It is preferable to utilize light emitted from a triplet excitation state (phosphorescence) in order to increase brightness. FIG. 5B shows an example of this type of element structure. An anode 310 is formed from ITO, a hole injecting layer 311 is formed from the phthalocyanine-based material CuPc, and a light emitting layer 313 is formed using the carbazole-based CBP+Ir(ppy)$_3$ on a hole transporting layer 312 formed from the aromatic amine-based material α-NPD. In addition, the light emitting element is structured by forming a hole blocking layer 314 using batho-cuproene (BCP) and forming an electron injecting layer 315 using Alq$_3$ and a cathode 316 made from ytterbium (Yb).

The aforementioned two structures are examples of using low molecular weight organic compounds, but organic light emitting elements can also be realized by combining high molecular weight compounds and low molecular weight compounds. FIG. 5C is such an example, and a hole injecting layer 321 is formed from the high molecular weight organic compound polythiophene derivatives (PEDOT) on an anode 320 made from ITO, a hole transporting layer 322 is formed from α-NPD, a light emitting layer 323 is formed from CBP+Ir(ppy)$_3$, a hole blocking layer 324 is formed by BCP, an electron injecting layer 325 is formed from Alq$_3$, and a cathode 326 is formed from ytterbium (Yb). The hole injecting properties of the hole injecting layer are improved by changing the hole injecting layer material to PEDOT, and the light emission efficiency can be increased.

The carbazole-based CBP+Ir(ppy)$_3$ used as a light emitting layer is an organic compound in which light emission from a triplet excitation state (phosphorescence) can be obtained. The organic compounds recorded in the following papers can be given as typical materials for triplet compounds. 1) Tsutsui, T., Adachi, C., and Saito, S., Photochemical Processes in Organized Molecular Systems, Ed. Honda, K., Elsevier Sci. Pub., Tokyo, 1991, p. 437. 2) Baldo, M. A., O'Brien, D. F., You. Y., Shoustikov, A., Sibley, S., Thompson, M. E., and Forrest, S. R., Nature 395 (1998) p. 151. In this paper, an organic compound is disclosed. 3) Baldo, M. A., Lamansky, S., Burrows, P. E., Thompson, M. E., and Forrest, S. R., Appl. Phys. Lett., 75 (1999) p. 4. 4) and Tsutsui, T., Yang, M. J., Yahiro, M., Nakamura, K., Watanabe, T., Tsuji, T., Fukuda, Y., Wakimoto, T., and Mayaguchi, S., Japan Appl. Phys., 38 (12B) 1999, L1502.

Furthermore, not only can the light emitting materials recorded in the above papers be used, it is also considered utilization of light emitting materials represented by the following molecular formula (specifically, metal complexes or organic compounds) is possible.

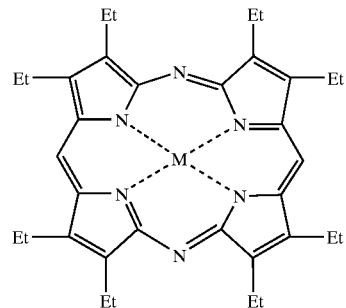

Chem 6

(In chemical formula, Et is ethyle group. M denotes elements residing in groups 8 to 10 of periodic table)

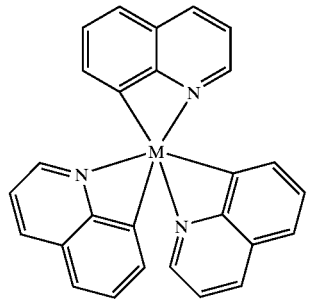

Chem 7

(In chemical formula, M denotes elements residing in groups 8 to 10 of periodic table)

Reference symbol M denotes elements residing in groups 8 to 10 of the periodic table in the above molecular formulae. Platinum and iridium are used in the above papers. Further, the applicants of the present invention consider that nickel, cobalt, and palladium are preferable to use because they are relatively low cost compared to platinum and indium, and therefore the cost of producing an EL display device can be reduced. In particular, nickel easily forms complexes, and therefore is considered to be preferable for its, high productivity. Whichever element is used, light emitted from a triplet excitation state (phosphorescence) has a higher light emission efficiency than that of light emitted from a singlet excitation state (fluorescence), and therefore it is possible to reduce the operation voltage (the voltage required to make the organic light emitting elements emit light) while obtaining the same brightness of light emitted.

The phthalocyanine-based CuPc, the aromatic amine-based α-NPD and MTDATA, and the carbazole-based CBP are all organic compounds which contain no oxygen. Oxygen or H$_2$O enter this type of organic compound, therefore bonding state changes like those explained using Chem 7 and Chem 5, and the hole transporting properties and light emitting properties are degraded. The film formation apparatus and the film formation method explained by FIGS. 1 to 3 in Embodiment 1 are employed in forming layers of these types of organic compounds. The oxygen concentration within the light emittino elements can thus be made equal to or less than 1×10$^{19}$/cm$^3$. In other words, the oxygen concentration in the hole injecting layers and in the hole transporting layers, and in their vicinity can be made equal to or less than 1×10$^{19}$/cm$^3$ in organic light emitting elements having phthalocyanine-based or aromatic amine-based hole injecting layers or hole transporting layers, and carbazole-based light emitting layers.

[Embodiment 3]

Figure 6:
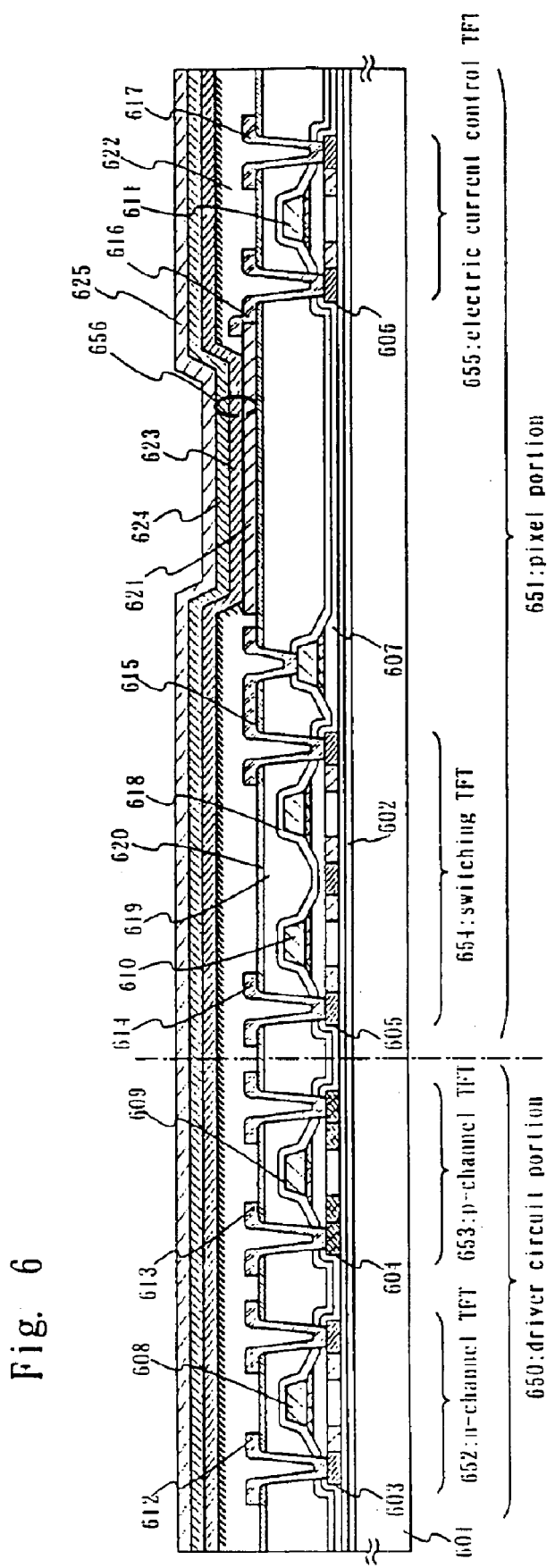
FIG. 6 is a cross sectional diagram of portions for explaining a structure of an organic light emitting device prepared with a pixel portion and a driver circuit portion.

FIG. 6 is an example showing a structure of an active matrix drive light emitting device. TFTs are formed in a pixel portion and in circuits having various functions in the periphery of the pixel portion. Amorphous silicon or polycrystalline silicon can be selected for the semiconductor film material used in forming channel forming regions of the TFTs, and either may be employed with the present invention.

A glass substrate or an organic resin substrate is employed as a substrate 601. Organic resin substrates have lighter weight compared to glass substrates, and are effective in reducing the weight of the light emitting device itself. Organic resin materials such as polyimide, polyethylene terephthalate (PET), polyethylene naphthalate (PEN), polyether sulfone (PES), and aramids are suitable for manufacturing light emitting devices as organic resin substrate. It is preferable to use glass substrates referred to as non-alkaline glass, namely barium borosilicate glass or aluminum borosilicate glass, as a glass substrate. Glass substrates employed have a thickness of 0.5 to 1.1 mm, and it is necessary to make the thickness thinner in order to achieve light weight. Further, it is preferable to employ glass substrates having a specific gravity of 2.37 g/cc for achieving light weight.

An n-channel TFT 652 and a p-channel TFT 653 are formed in a driver circuit portion 650 in FIG. 6, and a switching TFT 654 and an electric current control TFT 655 are formed in a pixel portion 651. These TFTs are formed using semiconductor films 603 to 606, a gate insulating film 607, gate electrodes 608 to 611, and the like on a first insulating layer 602 made from silicon nitride or silicon oxynitride ($SiO_xN_y$).

A second insulating layer 618 made from silicon nitride or silicon oxynitride is formed on the upper layer of the gate electrode, and is used as a protective film. In addition, an organic insulating film 619 made from polyimide or acrylic is formed as a leveling film. The organic insulating film is hygroscopic, and therefore possesses the ability to occlude $H_2O$. If this $H_2O$ is re-emitted, then oxygen is supplied to the organic compound, causing degradation of the organic light emitting element. A third insulating film 620 made from silicon nitride or silicon oxynitride is therefore formed on the organic insulating film 619 in order to prevent occlusion and re-emission of $H_2O$.

The circuit structure of a driver circuit portion 650 differs in a gate signal driver circuit and a data signal driver circuit, but this difference is omitted here. Wirings 612 and 613 are connected to an n-channel TFT 652 and a p-channel TFT 653, and it is possible to form circuits such as shift registers, latch circuits, and buffer circuits using these TFTs.

A source side of a switching TFT 654 is connected to a data wiring 614 in the pixel portion 651, and a drain side wiring 615 is connected to the gate electrode 611 of the electric current control TFT 655. Further, a source side of the electric current control TFT 655 is connected to an electric power source supply wiring 617, and a drain side electrode 616 is wired so as to be connected to an anode of an EL element.

An organic light emitting element 656 is composed of: an anode 621 formed from ITO (indium tin oxide); an organic compound layer 623 containing layers such as a hole injecting layer, a hole transporting layer, and a light emitting layer; and a cathode 624 formed by using materials such as alkaline metals, such as MgAg or Lif, or alkaline earth metals: all formed on a protective insulating film 620. The structure of the organic light emitting element may be arbitrary and the structures shown by FIGS. 5A to 5C can be employed. A bank 622 is formed from an organic resin such as polyimide or acrylic. The bank 622 is formed having a thickness on the order of 1 μm, and is formed so as to have a tapered shape in its edge portions. The bank 622 is formed so as to cover edge portions of the TFT wirings and the anode 621, preventing short circuits between the cathode and the anode in these portions.

However, materials such as polyimide which are used to form the bank have hygroscopic properties, and therefore the surface is made finer by plasma processing using argon, improving the surface so that compounds such as $H_2O$ are not occluded. The amount of gas re-emitted from the bank is thus reduced, and the organic compounds do not degrade.

The cathode 624 of the organic light emitting element uses a material containing magnesium (Mg), lithium (Li), or calcium (Ca), which has small work coefficient. An electrode made from MgAg (a material in which Mg and Ag are mixed at a ratio of Mg:Ag=10:1) is preferably used. MgAgAl electrodes, LiAl electrodes, and LiFAl electrodes can also be given as possible electrodes. In addition, a fourth insulating film 625 is formed from silicon nitride or a DLC film on the upper layer of the electrode. DLC films are known to be good barriers to compounds such as oxygen, CO, $CO_2$ and $H_2O$. It is preferable to form the protective film 625 in succession after forming the cathode 624, without exposure to the atmosphere. A buffer film made from a silicon nitride may be formed below the protective film 625. The interface state between the cathode 624 and the organic compound layer 623 has a great influence on the light emission efficiency of the organic light emitting element.

A multi-gate structure is used for the switching TFT 654 in FIG. 6, and a low concentration drain (LDD) overlapping with the gate electrode is formed in the electric current control TFT 655. TFTs using polycrystalline silicon show high operation speed, and thus deterioration such as that due to hot carriers injection also occurs easily. The formation of TFTs which have different structures corresponding to their function within the pixel (a switching TFT having a sufficiently low off current and an electric current control TFT which is strong against hot carrier injection) is therefore extremely effective in the manufacture of display devices having good reliability and capable of good image display (high operational performance), as shown in FIG. 6.

The first insulating film 602 is formed in the lower layer side of the semiconductor film forming the TFTs 654 and 655 (the substrate 601 side), as shown by FIG. 6, the second insulating film 618 is formed on the opposite side, the upper layer side. The third insulating film 620 is formed on the lower layer side of the organic light emitting element 656, and the fourth insulating film 625 is formed on the upper layer side. The organic light emitting element 656 is then formed between both and is sandwiched between the third insulating film 620 and the fourth insulating film 625, and they are joined. It can be thought that the substrate 601 and the organic light emitting element 636 are contamination sources of alkaline metals such as sodium, those most disliked by the TFTs 654 and 655, but these are blocked by being surrounded by the first insulating film 602 and the second insulating film 618. On the other hand, the organic light emitting element 656 most dislikes oxygen and $H_2O$, and therefore the third insulating film 620 and the fourth insulating film 625 are formed in order to block oxygen and $H_2O$. These films also function such that alkaline metal elements of the organic light emitting layer 656 do not escape.

Figure 7:
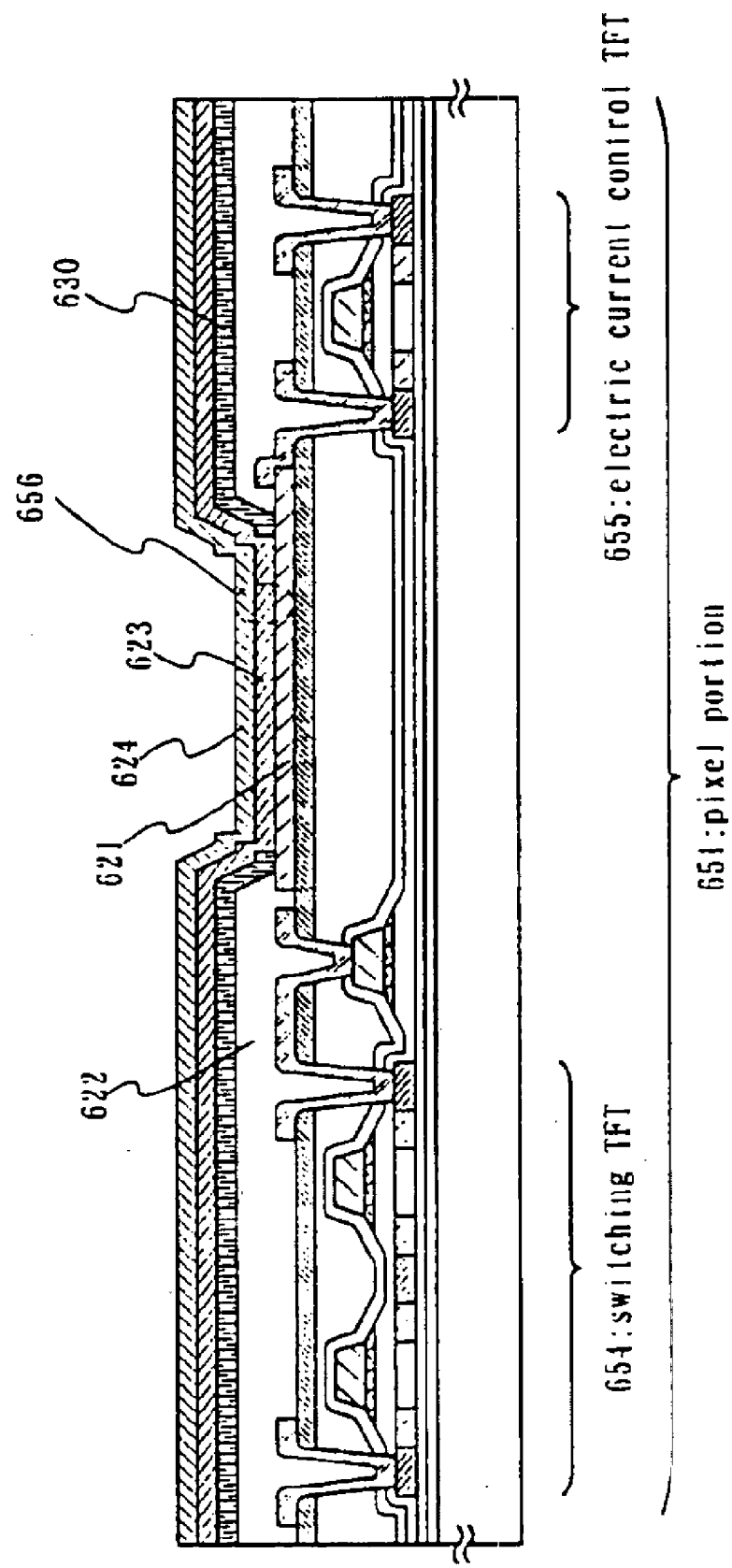
FIG. 7 is a cross sectional diagram of portions for explaining a structure of a pixel portion of an organic light emitting device.

Further, another form for preventing the re-emission of moisture and gas from organic resins such as polyimide is shown in FIG. 7. The bank 622 is formed after forming the anode 621. Next, a gas barrier layer 630 made from a silicon nitride film is formed by sputtering or plasma CVD. The silicon nitride film is first formed over the entire surface, and therefore the surface of the anode 621 is exposed by an etching process. Thereafter, the organic light emitting element 656 is completed by forming the organic compound layer 623 and the cathode 624. As not shown here, a protective film may be formed from silicon nitride, silicon oxynitride or DLC on the cathode 624. It is preferable to form the protective film in succession after forming the cathode, without exposure to the atmosphere. Also, film made from silicon nitride may be form as a buffer film of the protective film before the protective film is formed.

In addition, one example of an efficient method of manufacture that can be employed for an organic light emitting device having a structure like that shown by FIG. 6 is successive film formation processes by sputtering the third insulating film 620 and the anode 621 manufactured by a transparent conductive film, typically ITO. Conspicuous damage is not imparted to the surface of the organic insulating film 619, and a fine silicon nitride film or silicon oxynitride film can be formed by applying sputtering.

The TFTs and the organic light emitting devices are combined, forming the pixel portion, and the light emitting device can thus be completed. Driver circuits can also be formed on the same substrate by using TFTs with this type of light emitting device. As shown by FIG. 6 and FIG. 7, by surrounding the semiconductor films, the gate insulating films, and the gate electrodes, which are the main structural elements, by blocking layers and protecting films made from silicon nitride or silicon oxynitride on the lower surface and upper surface sides of the main structural elements, the structure of main structural elements becomes one capable of preventing contamination by alkaline metals and organic compounds. On the other hand, the organic light emitting elements contain alkaline metals in portions, and are surrounded with a protective film made from silicon nitride, silicon oxynitride or DLC and a gas barrier layer made from silicon nitride or an insulating film having carbon as its main constituent. Therefore the structure of the organic light emitting elements becomes one capable of preventing the incursion of oxygen and $H_2O$ from the outside.

With the present invention, a technique is provided for completing a light emitting device by combining elements having differing properties with respect to impurities, without any mutual interference.

[Embodiment 4]

A top gate TFT structure is explained by Embodiment 3, but it is of course also possible to apply bottom gate TFTs and a reverse stagger TFTs. A pixel portion 751 is formed by reverse stagger TFTs in FIG. 8, and a switching TFT 754 and an electric current control TFT 755 are formed. Gate electrodes 702 and 703, and a wiring 704 are formed from a material such as molybdenum or tungsten on a substrate 701, and a first insulating film 705 which functions as a gate insulating film is formed on the wiring 704. The first insulating film is formed having a thickness of 100 to 200 nm from a material such as silicon oxide or silicon nitride.

In addition to channel forming regions, source or drain regions and LDD regions are formed in semiconductor films 706 and 707. Insulating films 708 and 809 are formed in order to form these regions, or in order to protect the channel forming regions. A second insulating film 710 is formed from silicon nitride or silicon oxynitride, and is formed so that the semiconductor films are not contaminated by compounds such as alkaline metals and organic compounds. In addition, a leveling film 711 made from an organic resin material such as polyimide is formed. A third insulating film 712 made from silicon nitride or silicon oxide is formed on the leveling film. Wirings 713 to 716 are formed on the third insulating film 712.

Figure 8:
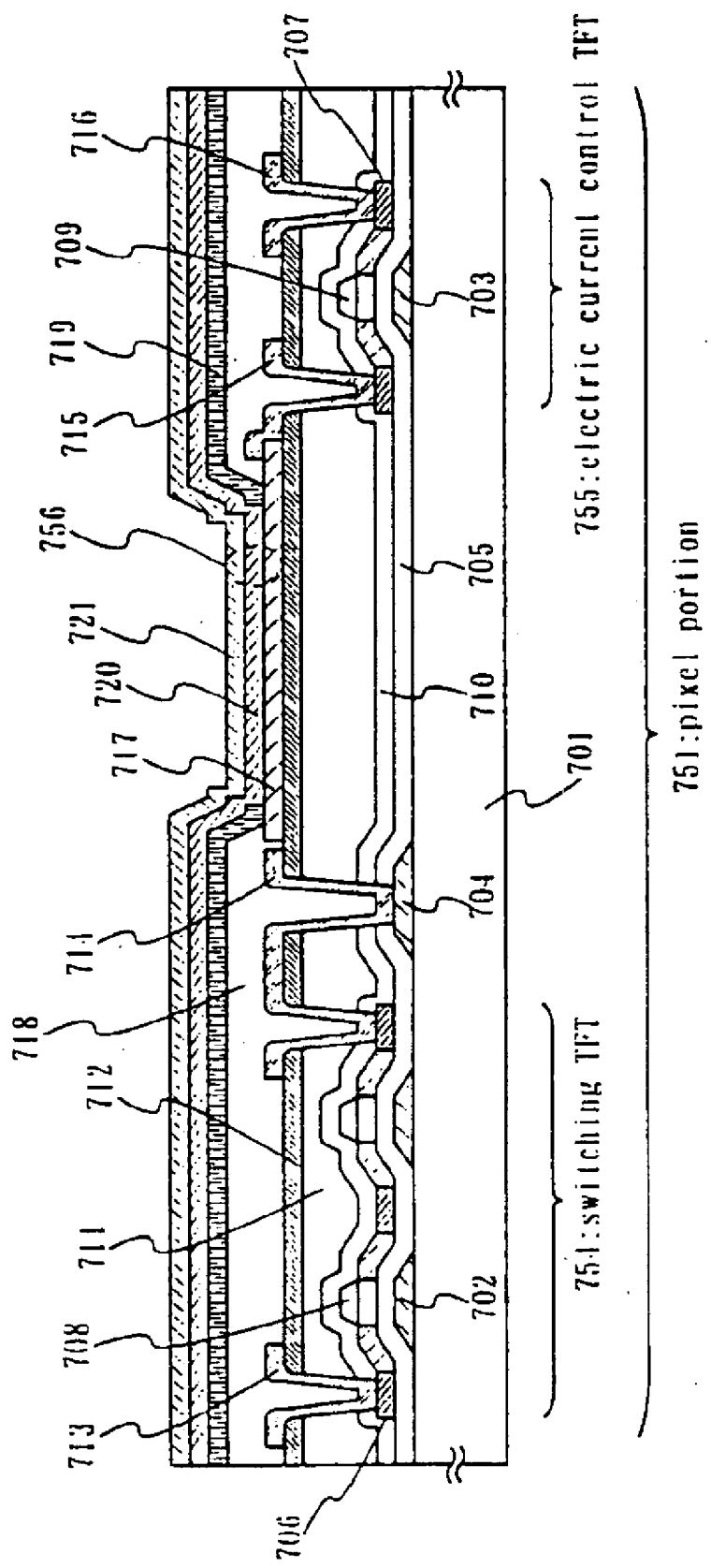
FIG. 8 is a cross sectional diagram of portions for explaining a structure of a pixel portion of an organic light emitting device.

An anode 717 of an organic light emitting element 756 is formed on the third insulating film 712, and a bank 718 is formed next from polyimide. Plasma preprocessing using argon may be performed on the surface of the bank 718, making the surface finer as in FIG. 6, and an gas barrier layer 719 made from a silicon nitride film may be formed as shown by FIG. 8 in order to prevent gas emission. The structures of an organic compound layer 720, a cathode 721, and a fourth insulating film are similar to those of Embodiment 2. A light emitting device using reverse stagger TFTs can thus be completed.

Further, driver circuits may also be formed on the same substrate using reverse stagger TFTs. As shown by FIG. 8, by surrounding the semiconductor films, which are the main structural elements of TFT, by the first insulating film and the second insulating film that are made from silicon nitride or silicon oxynitride on the lower surface and upper surface sides of the main structural elements, the structure of the semiconductor films becomes one capable of preventing contamination by alkaline metals and organic compounds. On the other hand, the organic light emitting elements contain alkaline metals in portions, and the structure of the organic light emitting elements becomes one capable of preventing the incursion of oxygen and $H_2O$ from the outside by sandwiching between the third insulating film and the fourth insulating film. A technique is thus provided for completing a light emitting device by combining elements having differing properties with respect to impurities, without any mutual interference, while using reverse stagger TFTs.

[Embodiment 5]

Figure 9:
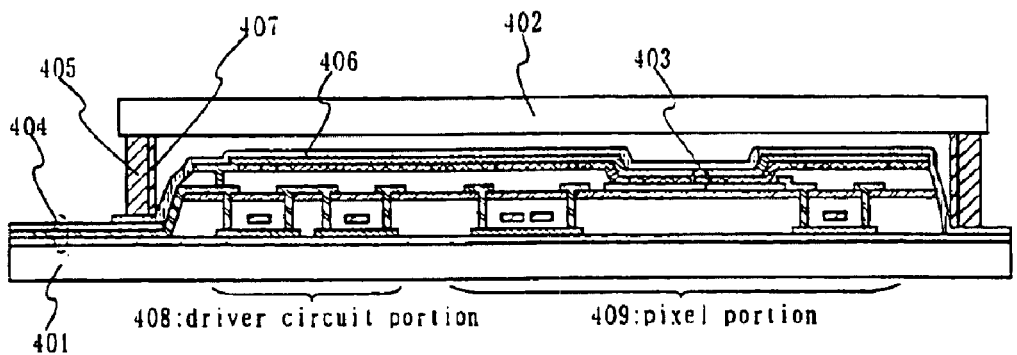
FIG. 9 is a cross sectional diagram for explaining a structure of an organic light emitting device.

A structure for sealing the organic light emitting elements formed by Embodiment 3 or Embodiment 4 is shown in FIG. 9. FIG. 9 shows an embodiment for fixing an element substrate 401, on which a driver circuit 408 and a pixel portion 409 are formed using TFTs, and a sealing substrate 402 by using a sealing material 405. A protective film 406 is formed from silicon nitride, silicon oxynitride, or DLC. A buffer film made from a silicon nitride may be formed below the protective film 406. Organic light emitting elements 403 are formed within a sealing region between the element substrate 401 and the sealing substrate 402, a drying agent may be formed on a driver circuit 408 and in the vicinity of where the sealing material 405 is formed.

Organic resin materials such as polyimide, polyethylene terephthalate (PET), polyethylene naphthalate (PEN), polyether sulfone (PES), and aramids are used for the sealing substrate. A substrate having a thickness on the order of 30 to 120 μm is employed, giving the substrate flexibility. A DLC film 407 is formed adjacent to the sealing material 405 as a gas barrier layer. Note that the DLC film is not formed on an external input terminal 404. An epoxy-based adhesive is used as the sealing material. By forming the DLC film 407 along the sealing material 405, and along edge portions of the element substrate 401 and the sealing substrate 402, water vapor permeating from these portions can be prevented.

Figure 10:
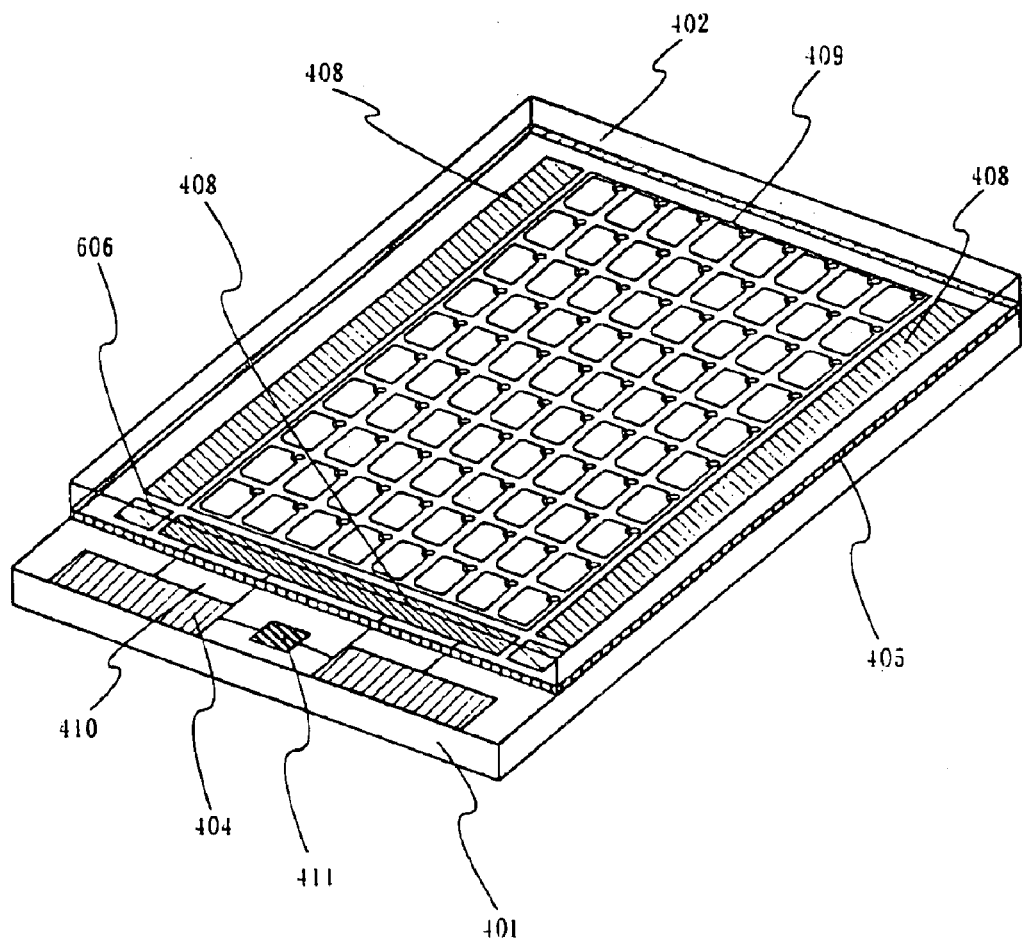
FIG. 10 is a perspective view diagram for explaining the external appearance of an organic light emitting device.
Figure 11:
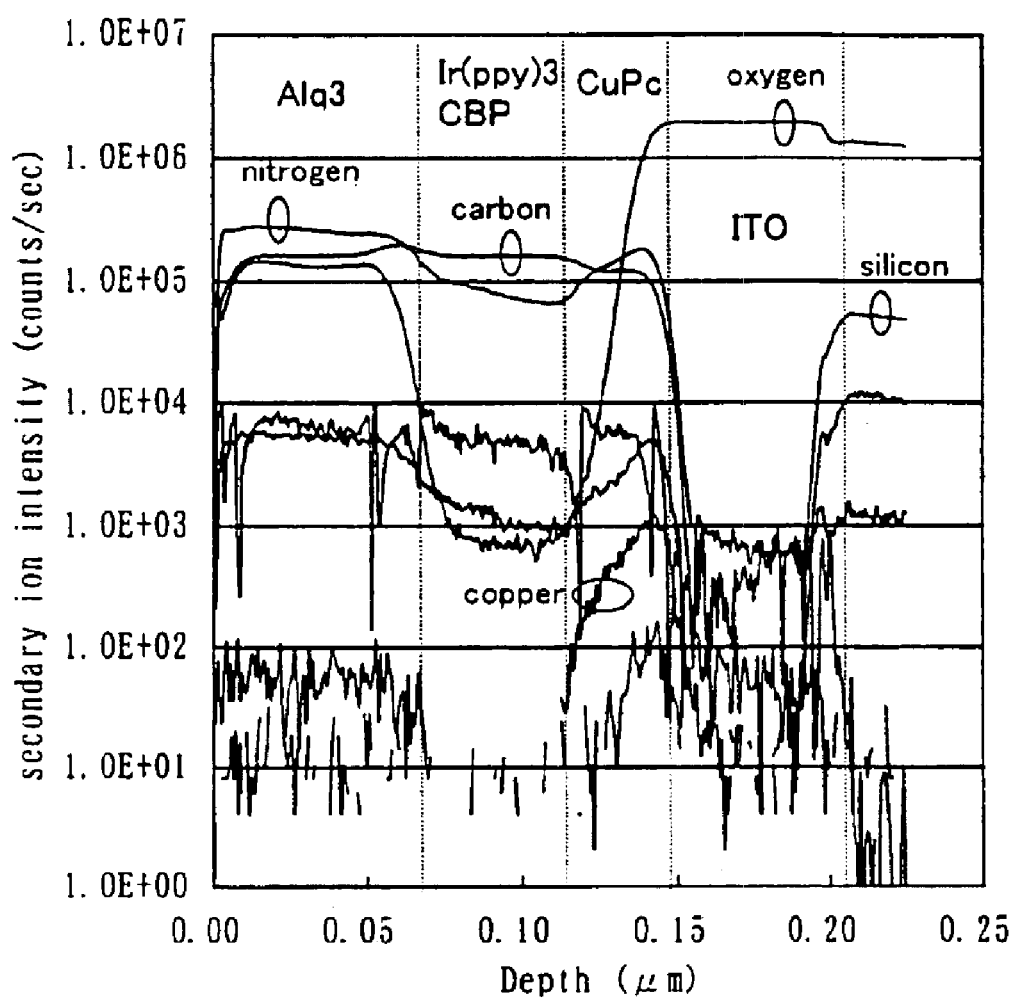
FIG. 11 is a graph obtained by SIMS measurement and showing the distribution in the depth direction of each chemical element in a test piece having an $Alq_3/Ir(ppy)_3+CBP/CuPc/ITO$ structure.
Figure 12:
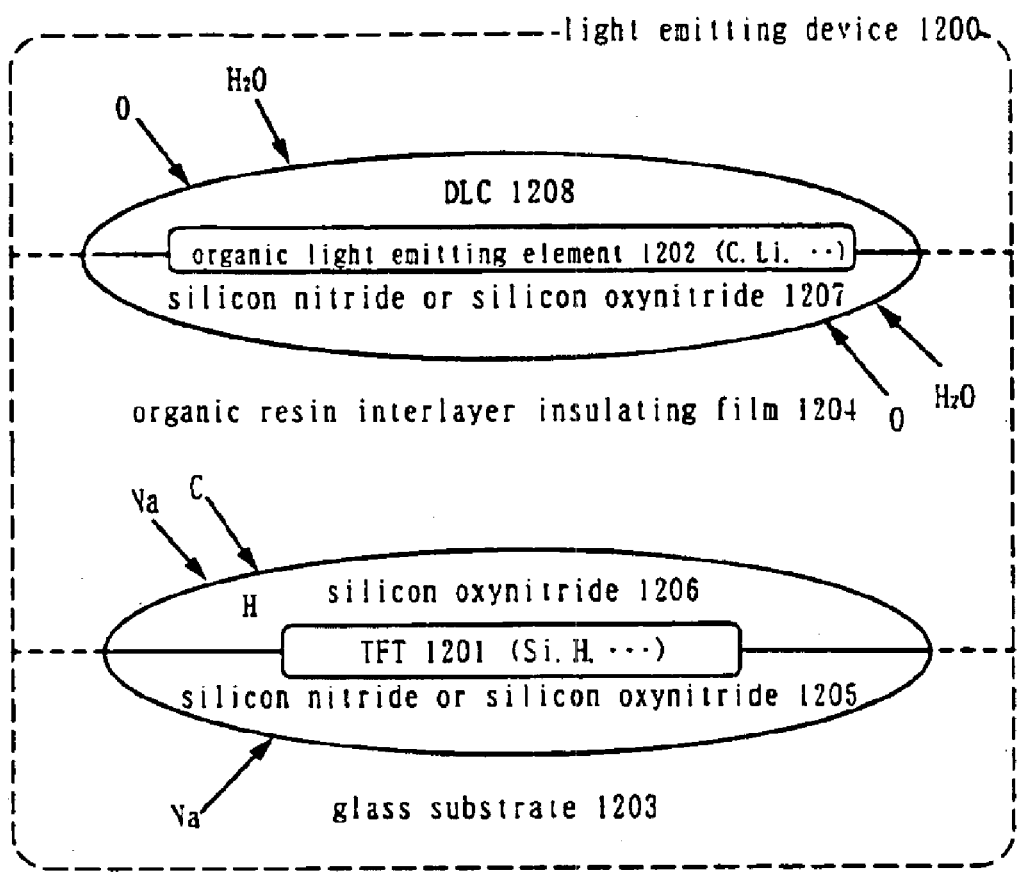
FIG. 12 is a diagram for explaining the concept of a light emitting device of the present invention.

FIG. 10 is a diagram showing an external view of this type of display device. The image display direction differs depending upon the structure of the organic light emitting elements, but a display device in which light is irradiated toward the top, forming a display, is shown here. The structure shown by FIG. 10 is one in which the element substrate 401 on which a driver circuit portion 408 and a pixel portion 409 are formed using TFTs, and the sealing substrate 402 are joined by the sealing material 405. In addition of the drive circuit portion 408, a signal processing circuit 606 for correct of video signals and memory of signals, may be formed The input terminal 404 is formed in the edge of the element substrate 401 and an FPC (flexible printed circuit) is connected with the edge of the element substrate 401. Terminals for the input of image data signals from external circuits, various types of timing signals, and electric power sources are formed having a 500 μm pitch in the input terminal 404. A driver circuit portion is connected with terminals for the input through a wiring 410. Further, an IC chip 411 on which components such as a CPU and memory are formed may also be mounted to the element substrate 401 by a method such as COG (chip on glass) when necessary.

The DLC film is formed adjacent to the sealing material, preventing the incursion of water vapor and oxygen from the seal portions, and protecting the organic light emitting elements from degradation. If organic resin materials are used in the element substrate 401 or the sealing substrate 402, then the DLC film may be formed over the entire surface, except for the input terminal portion. The input terminal portion may be, covered in advance using masking tape or a shadow mask during film formation of the DLC film.

The organic light emitting elements formed by Embodiment 3 or Embodiment 4 can thus be sealed, and a light emitting device can be formed. The TFTs and the organic light emitting elements are all surrounded by insulating films, becoming a structure into which impurities from the outside do not penetrate. In addition, the airtight properties can be strengthened by joining the sealing substrate to the element substrate using the sealing material and covering the edge portions by DLC, preventing degradation of the light emitting device.

As explained above, the concentration of oxygen as an impurity elements in a layer made from organic compounds which function as hole injecting layers, hole transporting layers, light emitting layers, and the like, for organic light emitting elements can be reduced to $5 \times 10^{19}/cm^3$ or less, preferably to $1 \times 10^{19}/cm^3$ or less, by using the present invention. It becomes possible to reduce impurity elements contained in organic compounds to the above levels by using the organic compound film formation apparatus and the film formation method disclosed by the present invention. Degradation of light emitting devices can thus be reduced.

Further, according to the present invention, semiconductor films, gate insulating films, and gate electrodes, that are the main structural elements of TFTs are surrounded on the lower layer side and the upper layer side by blocking layers and protecting films made from silicon nitride or silicon oxynitride. Therefore, the structure of the main structural elements becomes one in which alkaline metal and organic compound contamination can be prevented. On the other hand, organic light emitting elements contain alkaline metals in portions, and if protective films made from silicon nitride or silicon oxynitride, and gas barrier layers made from silicon nitride or from insulating films having carbon as their main constituent, surround the organic light emitting elements, a structure is realized in which the incursion of oxygen and $H_2O$ from the outside can be prevented. Elements having differing properties with respect to impurities are combined, and a light emitting device having no mutual interference between the organic elements and the main structural elements of TFTs can be completed.

The present invention is not limited to active matrix drive light emitting devices, of course, and organic element degradation can also be controlled in passive matrix drive light emitting devices.

What is claimed is:

1. A light emitting device comprising:
   a light emitting layer comprising an organic material,
   wherein said light emitting layer contains oxygen at a concentration equal to or less than $1 \times 10^{19}$ $cm^{-3}$.

2. The light emitting device according to claim 1 wherein said light emitting layer comprising tris-8-quinolinolate aluminum complex (Alq3).

3. The light emitting device according to claim 1 wherein said light emitting device is an active matrix type device.

4. A light emitting device comprising:
   a substrate;
   an insulating film comprising silicon nitride over the substrate; and
   a light emitting layer comprising an organic material formed over the insulating film,
   wherein said light emitting layer contains oxygen at a concentration equal to or less than $1 \times 10^{19}$ $cm^{-3}$.

5. The light emitting device according to claim 4 wherein said light emitting layer comprises tris-8-quinolinolate aluminum complex (Alq3).

6. The light emitting device according to claim 4 further comprising a thin film transistor formed over the substrate and below said insulating film.

7. The light emitting device according to claim 4 wherein said light emitting device is an active matrix type device.

8. A light emitting device comprising:
   a substrate;
   an insulating film comprising silicon nitride over the substrate;
   an anode formed on said insulating film;
   a light emitting layer comprising an organic material formed over the anode; and
   a cathode formed over the light emitting layer,
   wherein said light emitting layer contains oxygen at a concentration equal to or less than $1 \times 10^{19}$ $cm^{-3}$.

9. The light emitting device according to claim 8 wherein said light emitting layer comprises tris-8-quinolinolate aluminum complex (Alq3).

10. The light emitting device according to claim 8 further comprising a thin film transistor formed over the substrate and electrically connected to said anode.

11. The light emitting device according to claim 8 wherein said light emitting device is an active matrix type device.

12. A light emitting device comprising:
    a substrate;
    a light emitting layer comprising an organic material formed over the substrate; and
    an insulating film comprising carbon formed over the light emitting layer,
    wherein said light emitting layer contains oxygen at a concentration equal to or less than $1 \times 10^{19}$ $cm^3$.

13. The light emitting device according to claim 12 wherein said insulating film comprises diamond like carbon.

14. The light emitting device according to claim 12 wherein said light emitting layer comprises tris-8-quinolinolate aluminum complex (Alq3).

15. The light emitting device according to claim 12 further comprising a thin film transistor formed over the substrate and electrically connected to said anode.

16. The light emitting device according to claim 12 wherein said light emitting device is an active matrix type device.

17. A light emitting device comprising:

a substrate;

an insulating film comprising silicon oxynitride over the substrate; and a light emitting layer comprising an organic material formed over the insulating film, wherein said light emitting layer contains oxygen at a concentration equal to or less than $1 \times 10^{19}$ cm$^{-3}$.

18. The light emitting device according to claim 17 wherein said light emitting layer comprises tris-8-quinolinolate aluminum complex (Alq3).

19. The light emitting device according to claim 18 further comprising a thin film transistor formed over the substrate and below said insulating film.

20. The light emitting device according to claim 17 wherein said light emitting device is an active matrix type device.

21. A light emitting device comprising:

a hole transporting layer comprising an organic material, wherein said hole injecting layer contains oxygen at a concentration equal to or less than $1 \times 10^{19}$ cm$^{-3}$.

22. The light emitting device according to claim 21 wherein said organic material is phthalocyanine-based organic compound.

23. The light emitting device according to claim 22 wherein said hole injecting layer is copper phthalocyanine (CuPc).

24. The light emitting device according to claim 21 wherein said device is an active matrix type device.

25. A light emitting device comprising:

a hole transporting layer comprising an organic material, wherein said hole transporting layer contains oxygen at a concentration equal to or less than $1 \times 10^{19}$ cm$^{-3}$.

26. The light emitting device according to claim 25 wherein said organic material is aromatic amine-based organic compound.

27. The light emitting device according to claim 26 wherein said hole transporting layer is at least one selected from the group consisting of 4,4',4"-tris(N-3-methylphenyl-N-phenylamino)-triphenylamine (MTDATA) and 4-4'-bis(N-(1-naphthyl)-N-phenylamino)-biphenyl (α-NPD).

28. The light emitting device according to claim 25 wherein said device is an active matrix type device.

29. A light emitting device comprising:

a electron injecting layer comprising an organic material, wherein said electron injecting layer contains oxygen at a concentration equal to or less than $1 \times 10^{19}$ cm$^{-3}$.

30. The light emitting device according to claim 29 wherein said electron injecting layer is a metal complex.

31. The light emitting device according to claim 30 wherein said electron injecting layer is tris-8-quinolinolate aluminum complex (Alq3).

32. The light emitting device according to claim 29 wherein said light emitting device is an active matrix type device.

33. A light emitting device comprising:

a electron transporting layer comprising an organic material, wherein said electron transporting layer contains oxygen at a concentration equal to or less than $1 \times 10^{19}$ cm$^{-3}$.

34. The light emitting device according to claim 33 wherein said light emitting device is an active matrix type device.

* * * * *